(12) United States Patent
Singleton et al.

(10) Patent No.: US 9,646,635 B2
(45) Date of Patent: May 9, 2017

(54) MAGNETORESISTIVE SENSOR

(71) Applicant: Seagate Technology LLC, Cupertino, CA (US)

(72) Inventors: Eric W. Singleton, Maple Plain, MN (US); Liwen Tan, Eden Prairie, MN (US); Jae-Young Yi, Prior Lake, MN (US); Konstantin Nikolaev, Bloomington, MN (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 0 days.

(21) Appl. No.: 14/808,430

(22) Filed: Jul. 24, 2015

(65) Prior Publication Data
US 2015/0332714 A1 Nov. 19, 2015

Related U.S. Application Data

(62) Division of application No. 14/036,995, filed on Sep. 25, 2013, now Pat. No. 9,121,886.

(51) Int. Cl.
*G01R 33/09* (2006.01)
*G11B 5/39* (2006.01)
*G01R 33/00* (2006.01)

(52) U.S. Cl.
CPC ........ *G11B 5/3912* (2013.01); *G01R 33/0017* (2013.01); *G01R 33/09* (2013.01); *G01R 33/098* (2013.01)

(58) Field of Classification Search
None
See application file for complete search history.

(56) References Cited

U.S. PATENT DOCUMENTS

| | | | | |
|---|---|---|---|---|
| 7,750,421 | B2* | 7/2010 | Horng | B82Y 25/00 257/421 |
| 8,270,125 | B2* | 9/2012 | Gill | B82Y 10/00 257/421 |
| 8,486,036 | B2 | 7/2013 | Tange et al. | |
| 8,537,504 | B2 | 9/2013 | Lin | |
| 8,786,036 | B2* | 7/2014 | Cao | H01L 43/00 257/295 |
| 9,121,886 | B2* | 9/2015 | Singleton | G01R 33/09 |
| 2002/0009616 | A1 | 1/2002 | Kamiguchi et al. | |
| 2005/0185454 | A1* | 8/2005 | Brown | H01L 43/08 365/171 |
| 2006/0180839 | A1* | 8/2006 | Fukumoto | B82Y 25/00 257/295 |
| 2007/0097560 | A1* | 5/2007 | Karr | B82Y 10/00 360/324.2 |
| 2009/0046395 | A1 | 2/2009 | Maehara et al. | |
| 2009/0168267 | A1* | 7/2009 | Lin | B82Y 10/00 360/324.2 |
| 2009/0174968 | A1 | 7/2009 | Singleton et al. | |
| 2009/0251829 | A1 | 10/2009 | Zhang et al. | |
| 2013/0094108 | A1 | 4/2013 | Gao et al. | |

(Continued)

*Primary Examiner* — Kevin Bernatz
(74) *Attorney, Agent, or Firm* — Holzer Patel Drennan

(57) ABSTRACT

Implementations disclosed herein allow a signal detected by a magnetoresistive (MR) sensor to be improved by providing for one or more alloyed layers that each includes a ferromagnetic material and a refractory material. The alloyed layers are provided adjacent to a shield element or between soft magnetic layers of the sensor stack.

17 Claims, 7 Drawing Sheets

(56) References Cited

U.S. PATENT DOCUMENTS

2015/0170686 A1* 6/2015 Singleton ............ G11B 5/3912
360/319
2015/0311430 A1* 10/2015 Singleton ............ H01L 43/08
257/421

* cited by examiner

MAGNETORESISTIVE SENSOR

CROSS-REFERENCE TO RELATION APPLICATION

This application is a divisional application of U.S. application Ser. No. 14/036,995, issued as U.S. Pat. No. 9,121,886, the entire disclosures of which are incorporated herein by reference for all purposes.

BACKGROUND

In a magnetic data storage and retrieval system, a magnetic read/write head includes a reader portion having a magnetoresistive (MR) sensor for retrieving magnetically encoded information stored on a magnetic disc. Magnetic flux from the surface of the disc causes rotation of a magnetization vector of a sensing layer of the MR sensor, which in turn causes a change in electrical resistivity of the MR sensor. The change in resistivity of the MR sensor can be detected by passing a current through the MR sensor and measuring a voltage change across the MR sensor. External circuitry then converts the voltage information into an appropriate format and manipulates that information to recover the information encoded on the disc.

Improvements in magnetic storage media and head technology allow areal recording densities on magnetic discs that are available today. However, as areal recording densities increase, smaller, more sensitive MR sensors are desired. As MR sensors become smaller in size, the MR sensors have potential to exhibit an undesirable magnetic response to applied fields from the magnetic disc. An effective MR sensor may reduce or eliminate magnetic noise and provide a signal with adequate amplitude for accurate recovery of the data written on the disc.

SUMMARY

Implementations described and claimed herein provide for an alloyed layer in a magnetoresistive (MR) sensor, the alloyed layer including ferromagnetic material and a refractory material. The alloyed layer may be adjacent to a shield element or between soft magnetic layers of a sensor stack.

This Summary is provided to introduce an election of concepts in a simplified form that are further described below in the Detailed Description. This Summary is not intended to identify key features or essential features of the claimed subject matter, nor is it intended to be used to limit the scope of the claimed subject matter. Other features, details, utilities, and advantages of the claimed subject matter will be apparent from the following more particular written Detailed Description of various implementations and implementations as further illustrated in the accompanying drawings and defined in the appended claims.

BRIEF DESCRIPTIONS OF THE DRAWINGS

DETAILED DESCRIPTION

Figure 1:
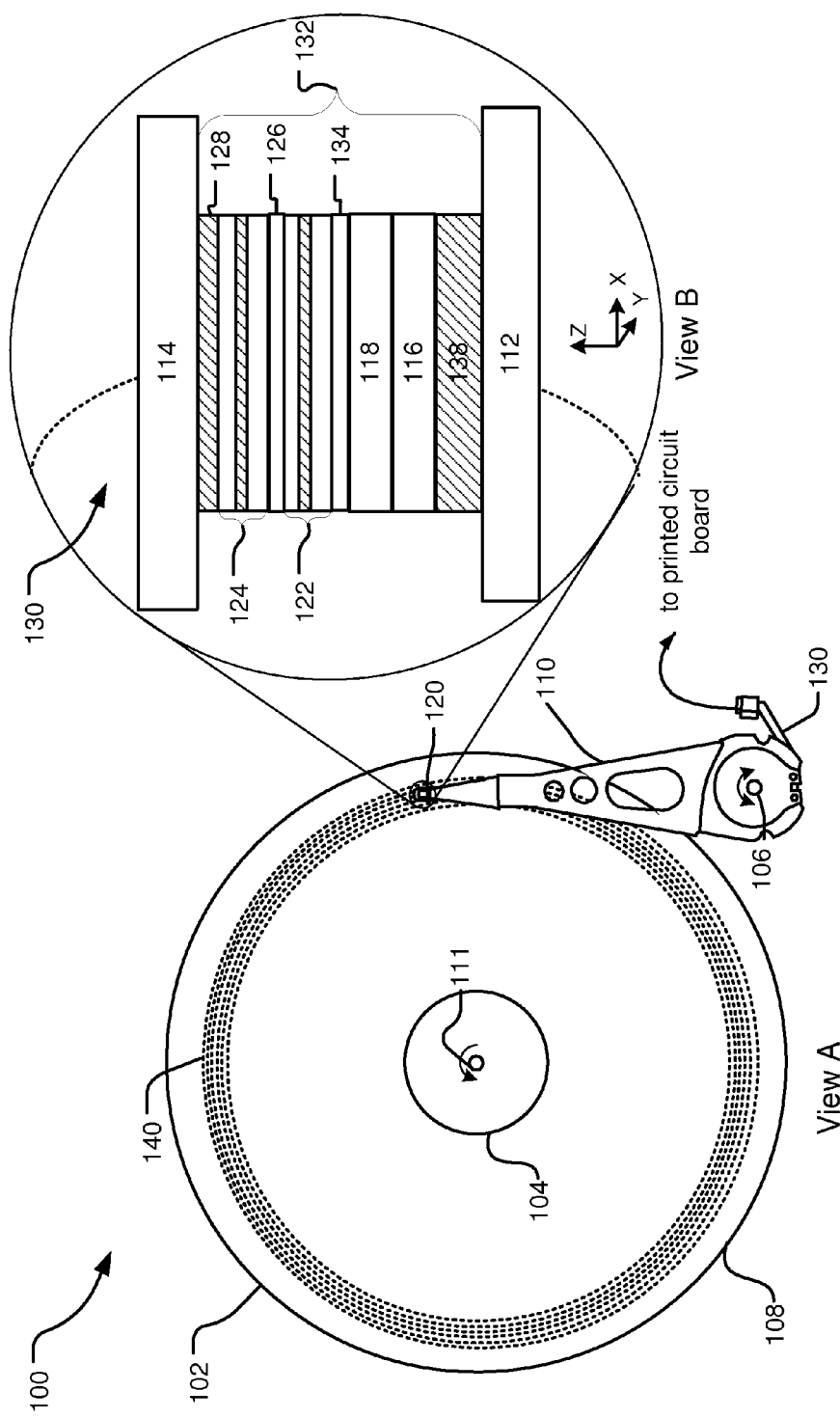
FIG. 1 illustrates a plan view of an example disc drive assembly.

There is an increasing demand for high areal densities and sensitive sensors to read data from a magnetic media. Giant Magnetoresistive (GMR) sensors that have increased sensitivity consist of two soft magnetic layers separated by a thin conductive, non-magnetic spacer layer such as copper. Tunnel Magnetoresistive (TMR) sensors provide an extension to GMR in which the electrons travel with their spins oriented perpendicularly to the layers across a thin insulating tunnel barrier. An antiferromagnetic (AFM) material is placed adjacent to the first soft magnetic layer to prevent it from rotating. AFM materials exhibiting this property are termed "pinning materials." With its rotation inhibited, the first soft layer is termed the "pinned layer." The second soft layer rotates freely in response to an external field and is called the "free layer" (FL). In some configurations, the AFM material may comprise a synthetic antiferromagnet (SAF) consisting of multiple thin ferromagnetic layers, one or more layer pairs being separated by a thin nonmagnetic layer. In this manner, a SAF may be employed to pin the magnetizing vector of the pinned layer.

To maximize TMR during formation of the MR sensor, some sensor designs include two or more individual soft magnetic layers laminated together by a thin insertion layer that prevents microstructural interference and diffusion between the soft magnetic layers at high temperatures. For example, the FL may include first and second soft magnetic layers adjacent to opposite sides of a thin tantalum layer. This thin tantalum layer separates the microstructure of the first and second soft magnetic layer and improves TMR in the MR sensor. Although some non-magnetic materials, such as tantalum, are effective at separating the microstructure of the soft magnetic layers, non-magnetic materials can dilute the magnetic moment of the adjacent soft magnetic layers and result in degradation of the signal-to-noise ratio (SNR) of the MR sensor, such as by increasing a damping constant affecting SNR. Additionally, a non-ferromagnetic material such as tantalum can weaken ferromagnetic coupling of the adjacent soft magnetic layers.

One implementation of the presently disclosed technology includes soft magnetic layers laminated together by an insertion layer that is both amorphous and magnetic. In one implementation, the insertion layer is an alloy including a ferromagnetic material, such as Co, Fe, Ni, CoFe, or NiFe, and a refractory material, such as Ta, Nb, Hf, Zr, etc. Because the insertion layer is magnetic, stability of the MR sensor is increased. In addition, SNR of the MR sensor is increased because the insertion layer does not, like a non-magnetic material, dilute the magnetic moment of adjacent soft magnetic layers.

According to another implementation of the presently-disclosed technology, an amorphous magnetic material is included in a seed layer of a reader stack of the MR sensor. The amorphous magnetic material magnetically couples with a bottom shield of the MR sensor, reducing shield-to-shield spacing (SSS) and improving MR sensor resolution.

In yet another implementation of the presently-disclosed technology, an amorphous magnetic material is included within a cap of a reader stack that is adjacent to a shield element. The amorphous magnetic material magnetically couples with the top shield, reducing shield-to-shield spacing (SSS) and improving MR sensor resolution.

The technology disclosed herein may be used in conjunction with a variety of different types of MR sensors (e.g., anisotropic magnetoresistive (AMR) sensors, TMR sensors, GMR sensors, etc.). Accordingly, the implementations discussed may also be applicable to new MR sensor designs that are based on new physical phenomena such as lateral spin valve (LSV), spin-hall effect (SHE), spin torque oscillation (STO), etc.

FIG. 1 illustrates a plan view of an example disc drive assembly 100. The example disc drive assembly 100 includes a slider 120 on a distal end of an actuator arm 110 positioned over a media disc 108. A rotary voice coil motor that rotates about an actuator axis of rotation 106 is used to position the slider 120 on a data track (e.g., a data track 140) and a spindle motor that rotates about disc axis of rotation 111 is used to rotate the media disc 108. Referring specifically to View A, the media disc 108 includes an outer diameter 102 and inner diameter 104 between which are a number of data tracks, such as a data track 140, illustrated by circular dotted lines. A flex cable 130 provides the requisite electrical connection paths for the slider 120 while allowing pivotal movement of the actuator arm 110 during operation.

The slider 120 is a laminated structure with a variety of layers performing a variety of functions. The slider 120 includes a writer section (not shown) and one or more MR sensors for reading data off of the media disc 108. View B illustrates a side of an example MR sensor 130 that faces an air-bearing surface (ABS) of the media disc 108 when the disc drive assembly 100 is in use. Thus, the MR sensor 130 shown in view B may be rotated by about 180 degrees about (e.g., about a z-axis) when operationally attached to the slider 120 shown in View A.

The MR sensor 130 utilizes magnetoresistance to read data from the media disc 108. While the precise nature of the MR sensor 130 may vary widely, a tunneling magnetoresistive (TMR) sensor is described as one example of an MR sensor that can be utilized with the presently-disclosed technology.

The MR sensor 130 includes a sensor stack 132 positioned between a top shield 114 and a bottom shield 112. The top shield 114 and the bottom shield 112 isolate the sensor stack 132 from electromagnetic interference, primarily z-direction interference, and serve as electrically conductive first and second electrical leads connected to processing electronics (not shown). In one implementation, the bottom shield 112 and the top shield 114 permit the sensor stack 132 to be affected by magnetic fields of a data bit directly under the MR sensor 130 while reducing or blocking magnetic field interference of other, adjacent data bits. Therefore, as the physical size of bits continues to decrease, the shield-to-shield spacing (SSS) should also be decreased.

The sensor stack 132 includes a seed layer 138 that initiates a desired grain structure in other layers of the sensor stack 132. According to one implementation, the seed layer 138 includes an amorphous magnetic under layer (not shown) that magnetically couples to the bottom shield 112, decreasing SSS of the MR sensor 130.

The sensor stack 132 also includes a synthetic antiferromagnetic (SAF) layer and an AFM layer 116, where the SAF layer includes a pinned layer 118, a coupling spacer layer 134, and a reference layer stack 122. The pinned layer 118 is a soft magnetic layer with a magnetic orientation biased in a given direction by the AFM layer 116. The coupling spacer layer 134 is adjacent to the pinned layer 118 and separates the pinned layer 118 from the reference layer stack 122. The reference layer stack 122 includes at least two soft magnetic layers laminated together and anti-ferromagnetically coupled to the pinned layer 118 by the coupling spacer layer 134. Because of this coupling, the magnetic moment of the reference layer stack 122 and pinned layer 118 are generally oriented normal to the plane of FIG. 1 and antiparallel to one another.

According to one implementation, the two or more soft magnetic layers of the reference layer stack 122 are laminated together by a thin layer of amorphous magnetic material. The amorphous magnetic material increases a coupling strength of the soft magnetic layers and improves stability of the MR sensor 100.

The MR sensor 100 further includes a free layer stack 124 that has a magnetic moment that is free to rotate under the influence of an applied magnetic field in the range of interest. According to another implementation, two or more soft magnetic layers of the free layer stack 124 are laminated together by a thin layer of amorphous magnetic material. The amorphous magnetic material increases a coupling strength of the soft magnetic layers and improves stability of the MR sensor 100.

A tunneling barrier layer 126 separates the reference layer stack 122 from the free layer stack 124. The tunneling barrier layer 126 is sufficiently thin to enable quantum mechanical electron tunneling between the reference layer stack 122 and the free layer stack 124. The electron tunneling is electron-spin dependent, making the magnetic response of the MR sensor 130 a function of the relative orientations and spin polarizations of the free layer stack 124 and of the SAF (i.e., the structure including the reference layer stack 122, the pinned layer 118, and the coupling spacer layer 134). The lowest probability of electron tunneling occurs when the magnetic moments of the SAF and the free layer stack 124 are antiparallel. Accordingly, the electrical resistance of the sensor stack 132 changes in response to an applied magnetic field.

The sensor stack 132 further includes a capping layer 128. The capping layer 128 magnetically separates the free layer stack 124 from the top shield 114. The capping layer 128 may include several individual layers (not shown). In one implementation, one or more layers of the capping layer 128 includes amorphous magnetic material. The amorphous magnetic material magnetically couples with the top shield 114 to reduce shield-to-shield spacing (SSS) of the MR sensor 130.

The data bits on the media disc 108 are magnetized in a direction normal to the plane of FIG. 1, either into the plane of the figure, or out of the plane of the figure. Thus, when the MR sensor 130 passes over a data bit, the magnetic moment of the free layer stack 124 is rotated either into the plane of FIG. 1 or out of the plane of FIG. 1, changing the electrical resistance of the MR sensor 130. The value of the bit being sensed by the MR sensor 130 (e.g., either 1 or 0) may therefore be determined based on the current flowing from a first electrode coupled to the AFM layer 116 and to a second electrode coupled to the capping layer 128.

Amorphous magnetic materials suitable for use in one or more of the reference layer stack 122, the free layer stack 124, the capping layer 128, and a seed under layer (not shown) may also exhibit one or more of the following properties: magnetic softness, relatively low magnetostriction, and a mill rate that is substantially the same as the mill rate of one or more other soft magnetic materials (e.g., CoFe) used in the MR sensor 130. In one implementation, a suitable amorphous magnetic material has a magnetostriction coefficient between $-1.0^{-5}$ and $+1.0^{-5}$.

The amorphous magnetic material may be an alloy that includes a ferromagnetic material, such as Co, Fe, CoFe, or NiFe, and a refractory material, such as Ta, Nb, Hf, Zr, etc. For example, the alloy may be CoFeX or NiFeX, where X is a refractory material. The alloy may include between 0 and about 30% of the refractory material, or enough to ensure that the alloy is amorphous. In one example implementation, the alloy is CoFeTa and comprises 15-25% Ta. The percent of refractory material included in the amorphous magnetic material is a variable value that may depend upon the refractory material and ferromagnetic material used in such alloy.

As used herein, "amorphous" refers to a solid that lacks the long-range order characteristic of a crystal. The amorphous magnetic material may be deposited as a thin film and remain amorphous during post-deposition processing, such as during a magnetic annealing process. In at least one implementation, the amorphous magnetic material does not include a glass-former. A glass former may be, for example, an element conducive to the occurrence of a glass transition in an amorphous solid material. Glass formers include, without limitation, silicon, boron, germanium, titanium, aluminum, zirconium, beryllium, magnesium, zinc, calcium, lead, lithium, sodium, and potassium. Excluding such glass-former elements from the amorphous magnetic alloy may permit the alloy to exhibit an increased magnetic moment as compared to the same or similar alloys including glass formers. This increase in magnetic moment can translate to an increase in sensor stability. Excluding the glass-former elements from the amorphous magnetic alloy also improves the thermal stability of the amorphous layer. Amorphous magnetic alloys that include glass formers may lack stability and crystallize during annealing processes.

Figure 2:
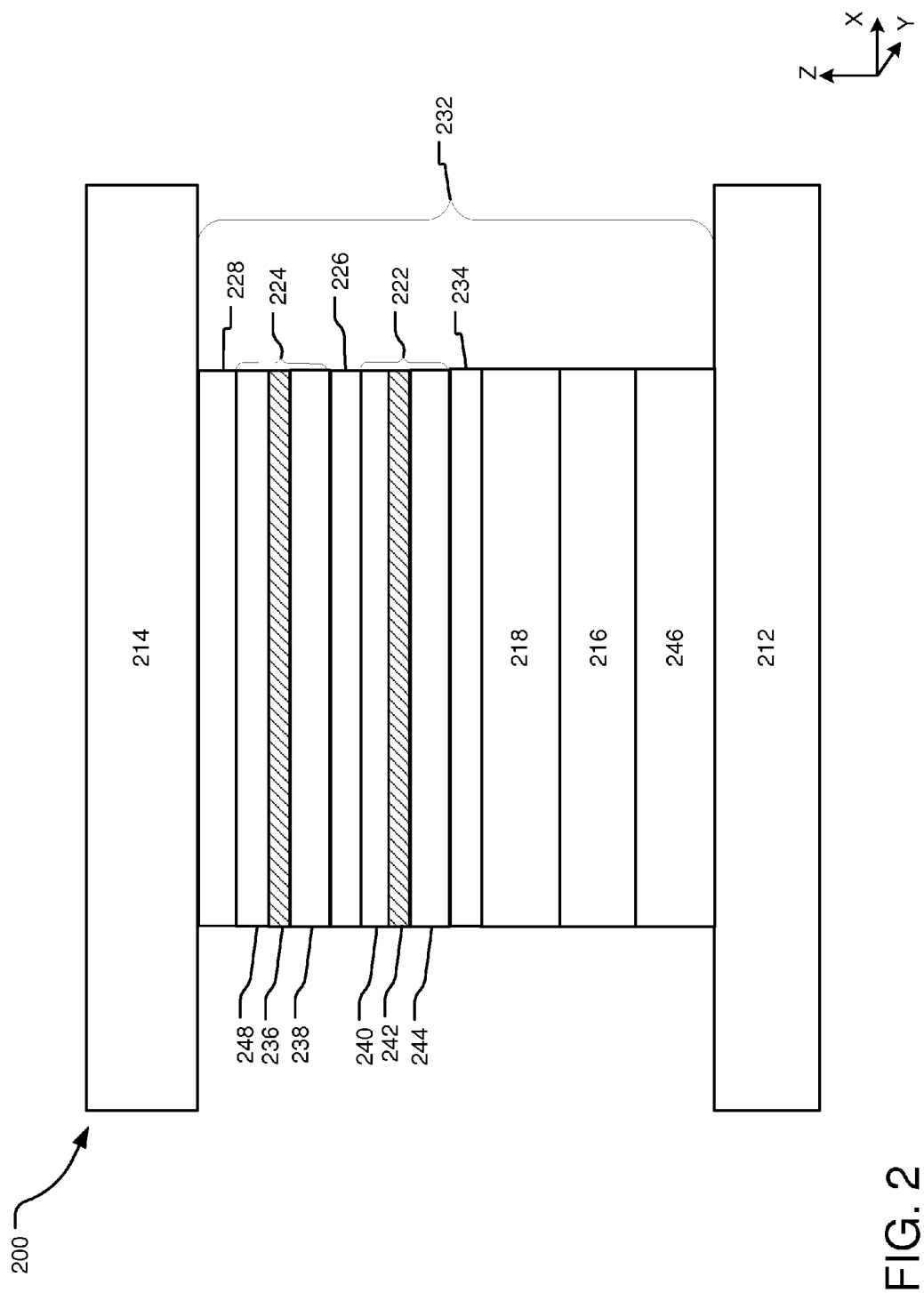
FIG. 2 illustrates an example MR sensor including layers of amorphous magnetic material.

FIG. 2 illustrates an example MR sensor 200 including layers of amorphous magnetic material between soft magnetic layers in a sensor stack 232. The sensor stack 232 is positioned between a top shield 214 and a bottom shield 212 and includes a number of layers that perform a variety of functions.

The sensor stack 232 includes a reference layer stack 222, which is a tri-layer structure including a first reference layer 244 separated from a second reference layer 240 by a reference insertion layer 242. The first and second reference layers 240 and 244 are soft ferromagnetic material and may be the same or different from one another in composition and thickness. According to one implementation, the reference insertion layer 242 is an amorphous magnetic material. Suitable amorphous magnetic materials include those discussed above with respect to FIG. 1. In at least one implementation, the amorphous magnetic material is an alloy of a refractory material and a ferromagnetic material. In other implementations, the reference layer stack 222 includes more than two reference layers and more than one reference insertion layer. For example, the reference layer stack 222 may include three reference layers and two insertion layers, with the reference insertion layers interleaved between the reference layers. In still other implementations, the reference layer stack 222 includes a single reference layer adjacent to a layer of magnetic amorphous material.

In one implementation, the first reference layer 244 has a z-direction thickness of about or substantially between 10 and 15 Angstroms, the second reference layer 240 has a z-direction thickness of about or substantially between 10 and 20 Angstroms, and the reference layer insertion layer 242 has a z-direction thickness of about or substantially between 1 and 10 Angstroms.

The sensor stack 232 also includes a free layer stack 224, which is a tri-layer structure including a first free layer 238 separated from a second free layer 248 by a free layer insertion layer 236. The first and second free layers 238 and 248 are soft ferromagnetic material and may be the same or different from one another in composition, material type, and thickness. In one implementation, the first free layer 238 is a first soft magnetic alloy, such as CoFeB, and the second free layer 248 is a second soft magnetic alloy, such as NiFe. According to one implementation, the free layer insertion layer 236 is an amorphous magnetic material that does not include a glass former element. Suitable amorphous materials include those discussed above with respect to FIG. 1. In one implementation, the free layer insertion layer 236 is a thin layer of CoFeTa. Soft magnetic alloys, such as CoFe and NiFe, are not amorphous but are crystalline. In other implementations, the free layer stack 224 includes more than two soft magnetic free layers.

The free layer stack 224 may include more than two free layers and/or more than one free layer insertion layer. For example, the free layer stack 224 may include three free layers and two free layer insertion layers, with the free layer insertion layers interleaved between the free layers. In still other implementations, the free layer stack 224 includes a single free layer adjacent to a layer of magnetic amorphous material, such as CoFeTa.

In one implementation, the first free layer 238 has a z-direction thickness of about or substantially between 20 and 25 Angstroms; the second free layer 248 has a z-direction thickness of about or substantially between 30-60 Angstroms; and the free layer insertion layer 236 has a z-direction thickness of about or substantially between 1 and 10 Angstroms.

When either the reference insertion layer 242 or the free layer insertion layer 236 is made of amorphous magnetic material, the coupling strength of corresponding adjacent soft magnetic layers increases as compared to an identical sensor with non-magnetic material (e.g., tantalum) in place of the amorphous magnetic material. For example, when the free layer insertion layer 236 is amorphous and magnetic, the coupling strength increases between the first free layer 248 and the second free layer 238. This increased coupling strength translates to improved sensor stability. In addition, the amorphous magnetic material improves SNR of the MR sensor 200 because it does not, like a non-magnetic material, dilute the magnetic moment of the adjacent soft magnetic layers.

In one implementation, both the reference insertion layer 242 and the free layer insertion layer 236 are amorphous magnetic materials. In another implementation, only one of the reference insertion layer 242 and the free layer insertion layer 236 is an amorphous magnetic material. In some implementations, the amorphous magnetic material may not include a glass former element. In various other implementations, the free layer stack 224 and/or the reference layer stack 222 includes more than two soft magnetic layers laminated together by amorphous magnetic material.

In addition to those layers discussed above, the sensor stack 232 also includes a seed layer 246 adjacent to an antiferromagnetic (AFM) layer 216. The AFM layer 216 biases the magnetic orientation of a pinned layer 218 in a set direction. A coupling spacer layer 234 provides an antiferromagnetic coupling (e.g., an RKKY coupling) between the pinned layer 218 and the reference layer stack 222, which increases the magnetic stiffness of the pinned layer 218.

The sensor stack 232 also includes a tunneling barrier layer 226 and a capping layer 228. These layers may have properties the same or similar as those discussed with respect to FIG. 1.

Figure 3:
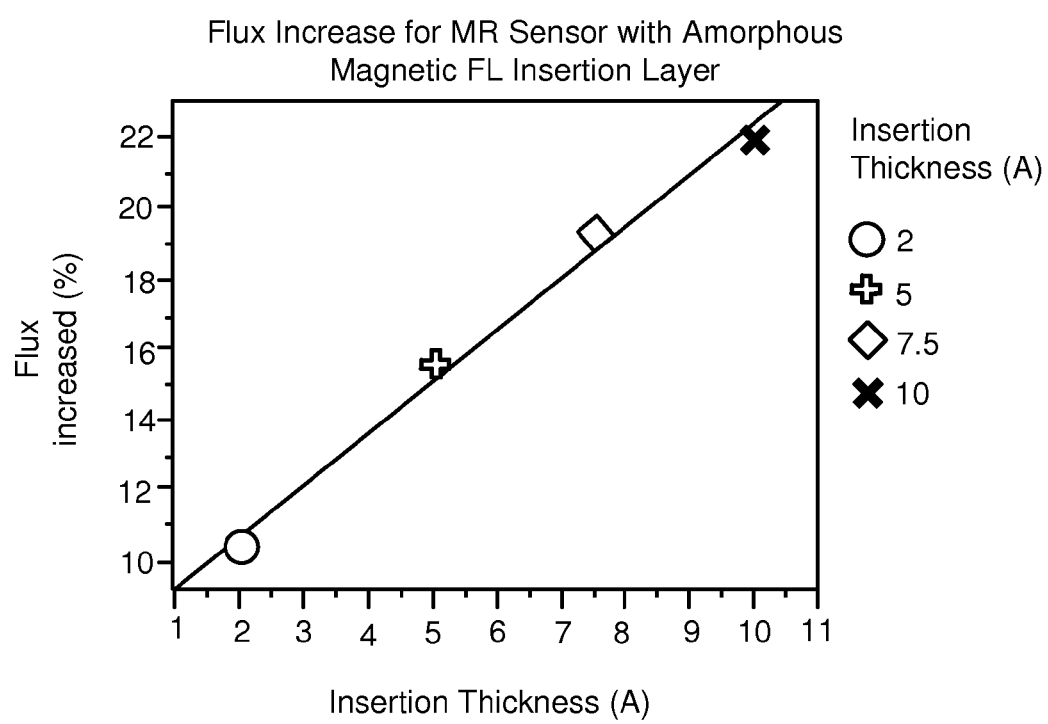
FIG. 3 illustrates a magnetic flux increase observed when amorphous magnetic material is included in an MR sensor.

FIG. 3 illustrates a free layer flux increase that occurs as a result of replacing a free layer insertion with amorphous magnetic material in an MR sensor. The data illustrated is collected from first and second MR sensors structurally the same or similar to the MR sensor 200 shown in FIG. 2. The first MR sensor has a free layer insertion layer made of tantalum; the second MR sensor has a free layer insertion layer made of CoFeTa. When the free layer insertion layer of each of the two MR sensors has a thickness of 2 Angstroms, the flux observed in the free layer of the second MR sensor is approximately 10% greater than the flux observed in the free layer of the first MR sensor. This correlation continues to increase linearly with the thickness of the free layer insertion layer. When the free layer insertion layer has a thickness of 10 angstroms, the flux observed in the free layer of the second MR sensor is approximately 22% greater than the flux observed in the free layer of the first MR sensor. This flux increase corresponds to a signal-to-noise ratio (SNR) gain on the order of 0.5 dB to 1 dB.

Figure 4:
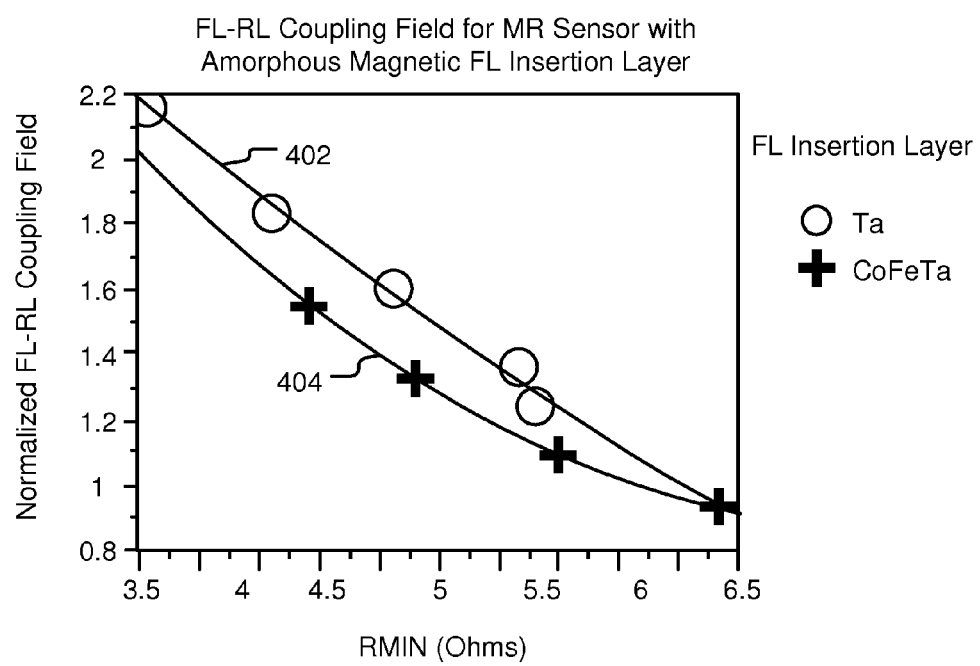
FIG. 4 illustrates a normalized coupling field between a free layer and a reference layer (FL-RL) of example MR sensors.

FIG. 4 illustrates a normalized coupling field between a free layer and a reference layer (FL-RL) of two example MR sensors. The first MR sensor, shown by dataset 402, has a free layer insertion layer made of tantalum; the second MR sensor, shown by dataset 404, is identical to the first MR sensor, but has a free layer insertion layer made of CoFeTa. The x-axis (RMIN) is the sensor resistance at a minimum state, a value that may be a preselected design parameter. The y-axis illustrates the strength of the FL-RL coupling field.

The FL-RL coupling field is noticeably lower for the second MR sensor with the CoFeTa insertion layer than for the first MR sensor with the Ta insertion layer. This FL-RL coupling field decrease is indicative of an improvement of rotation efficiency within the free layer, which translates to additional gain in SNR.

Figure 5:
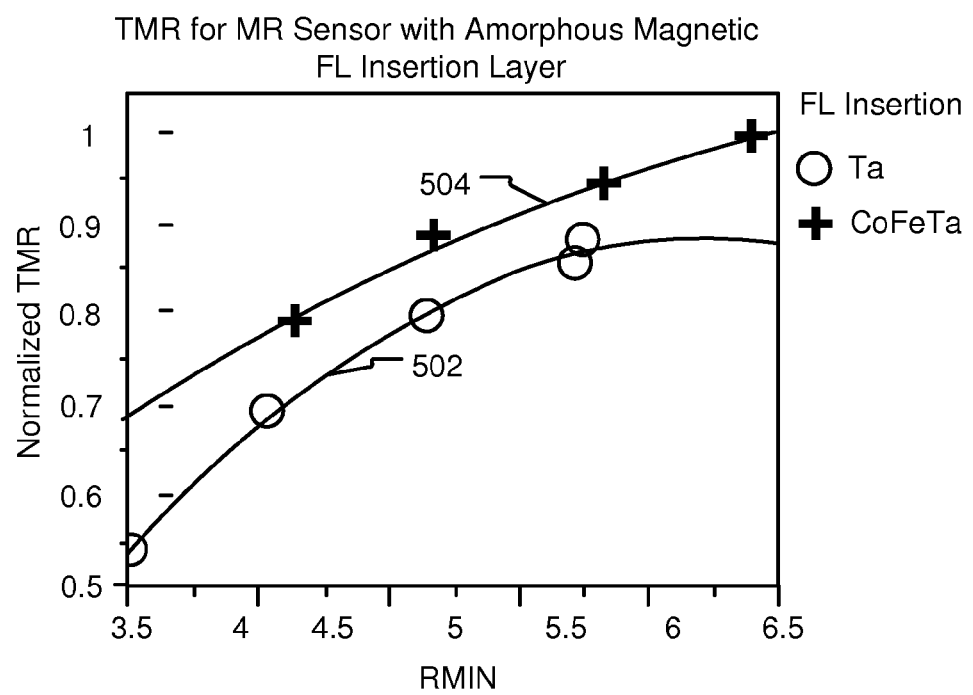
FIG. 5 illustrates tunneling magnetoresistance (TMR) of two example MR sensors.

FIG. 5 illustrates tunneling magnetoresistance (TMR) of two example MR sensors. The first MR sensor, shown by data set 502, has a free layer insertion layer made of tantalum; the second MR sensor, shown by data set 504, has a free layer insertion layer of CoFeTa. The x-axis (RMIN) of FIG. 5 illustrates the sensor resistance at a minimum state. The y-axis illustrates a normalized tunneling magnetoresistance (TMR) for each RMIN value. The second MR sensor with the CoFeTa free layer insertion layer exhibits a TMR increase over the first MR sensor with the tantalum free layer insertion layer. This TMR increase is indicative of further improved signal to noise of the second MR sensor.

Figure 6:
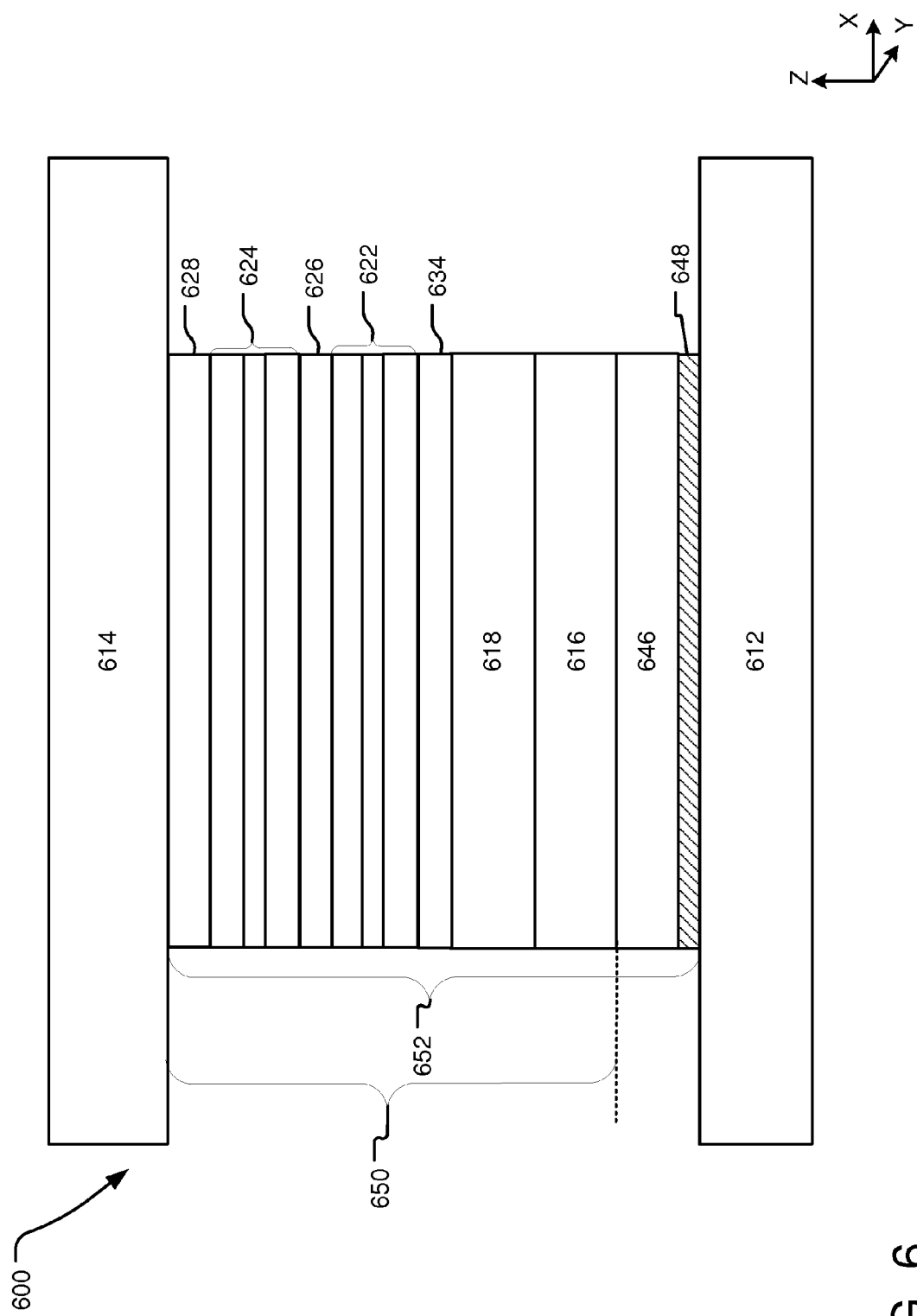
FIG. 6 illustrates an example MR sensor having an amorphous magnetic layer between a magnetic seed layer and a bottom shield.

FIG. 6 illustrates an example MR sensor 600 having an amorphous magnetic under layer 648 between a magnetic seed layer 646 and a bottom shield 612. The amorphous magnetic under layer 648 separates the microstructure of the magnetic seed layer 646 and the bottom shield 612. This allows for other layers of the sensor to be grown on top of the magnetic seed layer 646. The amorphous magnetic under layer 648 couples to the bottom shield 612, effectively reducing the SSS of the MR sensor 600 from a first distance 652 to a second distance 650. This allows the magnetic seed layer 646 to magnetically couple to the bottom shield 612. As a result of this coupling and reduced SSS spacing, shield stability is improved. The z-direction thickness of the amorphous magnetic under layer 648 may be about or substantially between 10 and 30 Angstroms. In the same or a different implementation, the adjacent seed layer 646 may have a z-direction thickness about or substantially between 50-300 Angstroms.

In another implementation, the MR sensor 600 includes soft magnetic side shields (not shown) that provide a stabilizing bias to a free layer stack 624. A seed layer is deposited on the MR sensor 600 prior to deposition of the side shields to initiate a desired grain structure in the side shields. The seed layer may be adjacent to the side shields and may include an amorphous magnetic material, such as other amorphous magnetic materials described herein.

In one implementation, the amorphous magnetic under layer 648 is an alloy that includes a refractory material and a ferromagnetic material. Other suitable amorphous magnetic materials include those discussed with respect to FIGS. 1 and 2.

The MR sensor 600 further includes a top shield 614, an AFM layer 616, a coupling spacer layer 634, a pinned layer 618, a reference layer stack 622, a tunneling barrier layer 626, a free layer stack 624, and a capping layer 628. Each of these layers may function the same or similar to corresponding layers described with respect to other implementations included herein.

Figure 7:
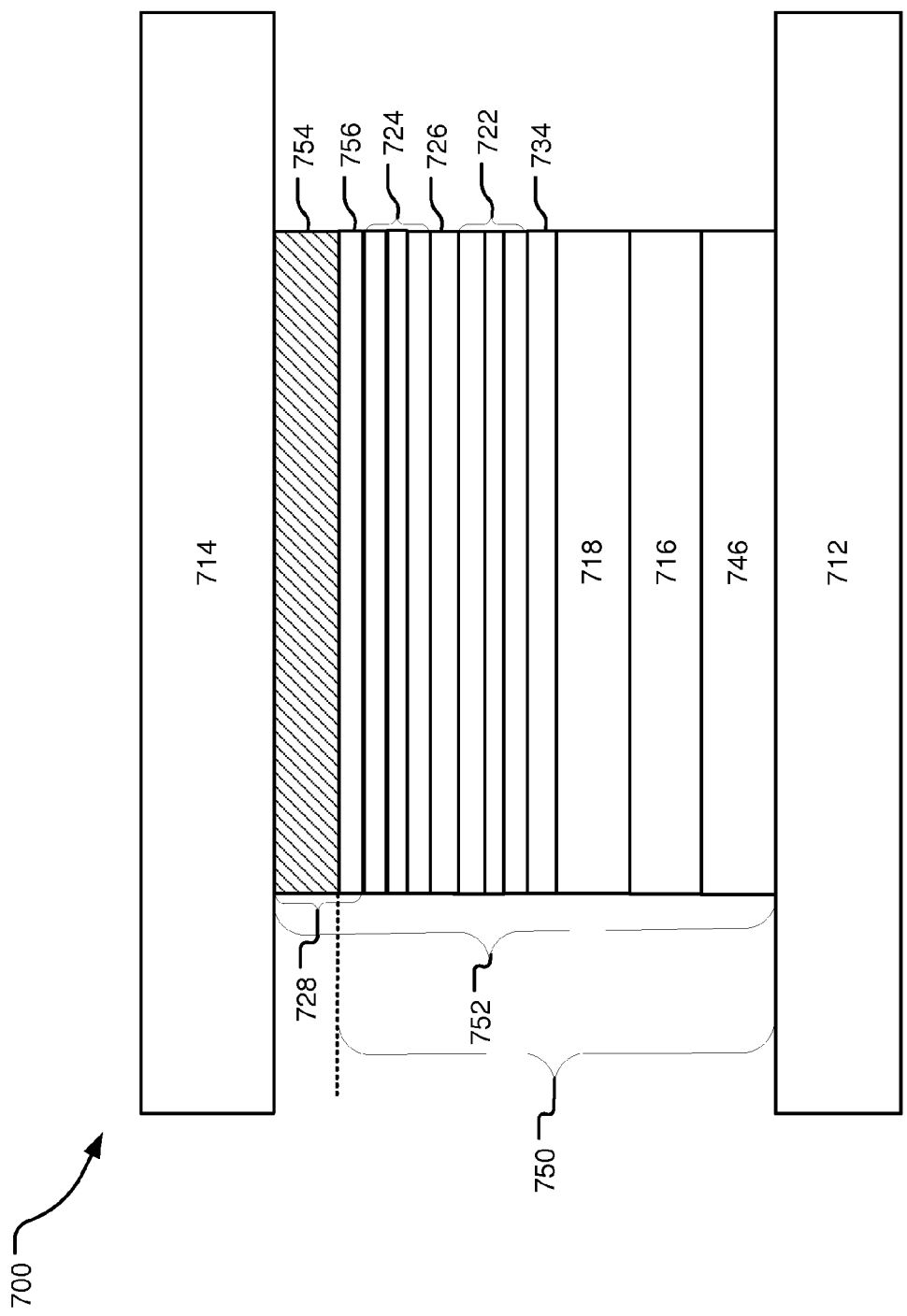
FIG. 7 illustrates an example MR sensor with a capping layer stack that includes amorphous magnetic material.

FIG. 7 illustrates an example MR sensor 700 with a capping layer stack 728 that includes amorphous magnetic material. The capping layer stack 728 is a dual-layer structure that magnetically separates a free layer stack 724 of the sensor stack from a top shield 714. In particular, the capping layer stack 728 includes a non-magnetic layer 756 adjacent to an amorphous magnetic layer 754. In one implementation, the non-magnetic layer 756 is ruthenium and the amorphous magnetic layer 754 is an alloy of a refractory material (e.g., Ta, Nb, Hf, Zr, etc.) and a ferromagnetic material (e.g., Co, Fe, CoFe, NiFe). The amorphous magnetic layer 754 magnetically couples with the top shield 714, reducing the effective shield-to-shield spacing from a first distance 752 to a second distance 750.

In the same or another implementation, the amorphous magnetic layer 754 has a thickness of about or substantially between 10 and 30 Angstroms, and the non-magnetic layer 756 has a thickness of about or substantially between 5 and 20 Angstroms.

In another implementation, the capping layer stack includes more than two layers.

In addition to those layers discussed above, the MR sensor 700 includes a bottom shield 712, a seed layer 746, an AFM layer 716, a coupling spacer layer 734, a pinned layer 718, a reference layer stack 722, and a tunneling barrier layer 726. Each of these layers may function the same or similar to corresponding layers described with respect to other implementations. In other implementations, an amorphous magnetic material is utilized in an element of the MR sensor other than those elements described herein.

The specific steps discussed with respect to each of the implementations disclosed herein are a matter of choice and may depend on the materials utilized and/or design criteria of a given system. The above specification, examples, and data provide a complete description of the structure and use of exemplary implementations of the invention. Since many implementations of the invention can be made without departing from the spirit and scope of the invention, the invention resides in the claims hereinafter appended.

What is claimed is:
1. A magnetoresistive (MR) sensor comprising:
 a reference structure including a first soft magnetic reference layer with a thickness between 10 and 15 Angstroms, a second soft magnetic reference layer with a thickness between 10 and 20 Angstroms magnetically coupled together, and a magnetic insertion layer adjacent to and between the first reference layer and the second reference layer, the magnetic insertion layer comprising a refractory material and excluding glass former elements; and a free stack including a first crystalline soft magnetic free layer with a thickness between 10 and 15 Angstroms, a second crystalline soft magnetic free layer with a thickness between 10 and 20 Angstroms magnetically coupled together, and an amorphous magnetic alloyed layer adjacent to and between the first free layer and the second free layer, the alloyed layer including ferromagnetic material and tantalum at 15-25 atomic % and excluding glass former elements.

2. The MR sensor of claim 1, wherein the alloyed layer has a thickness less than approximately 10 angstroms.

3. The MR sensor of claim 1, wherein the ferromagnetic material includes at least one of CoFe and NiFe.

4. The MR sensor of claim 1, wherein the alloyed layer is CoFeTa.

5. The MR sensor of claim 1, wherein the first crystalline soft magnetic free layer and the second crystalline soft magnetic free layer comprise CoFe.

6. The MR sensor of claim 1, wherein the magnetic insertion layer has a thickness less than approximately 10 angstroms.

7. The MR sensor of claim 1, wherein the magnetic insertion layer is amorphous.

8. The MR sensor of claim 7, wherein the magnetic insertion layer comprises a second ferromagnetic material and 15-25 atomic % tantalum.

9. The MR sensor of claim 7, wherein the magnetic insertion layer comprises a second ferromagnetic material and a refractory material.

10. The MR sensor of claim 9, wherein the refractory material is tantalum.

11. A magnetoresistive (MR) sensor comprising:
a reference stack comprising a first soft magnetic reference layer with a thickness of 10-15 angstroms, a second soft magnetic reference layer with a thickness of 10-20 angstroms, and a magnetic alloyed reference insertion layer adjacent to and between the first reference layer and the second reference layer, the alloyed reference insertion layer comprising a ferromagnetic material and a refractory material and excluding glass former elements; and a free stack comprising a first crystalline magnetic free layer, a second crystalline magnetic free layer magnetically coupled to the first free layer, and an amorphous magnetic alloyed insertion layer adjacent to and between the first free layer and the second free layer, the alloyed insertion layer comprising a second ferromagnetic material and a second refractory material and excluding glass former elements.

12. The MR sensor of claim 11, wherein each of the alloyed reference insertion layer and the alloyed insertion layer has a thickness less than approximately 10 angstroms.

13. The MR sensor of claim 11, wherein each of the alloyed reference insertion layer and the alloyed insertion layer comprises up to 30 atomic % refractory material.

14. The MR sensor of claim 13, wherein each of the alloyed reference insertion layer and the alloyed insertion layer comprises 15-25 atomic % tantalum.

15. The MR sensor of claim 11, wherein each of the alloyed reference insertion layer and the alloyed insertion layer has a magnetostriction coefficient between $-1.0^{-5}$ and $+1.0^{-5}$.

16. The MR sensor of claim 11, wherein at least one of the ferromagnetic material and the second ferromagnetic material includes at least one of CoFe and NiFe and at least one of the refractory material and the second refractory material comprises at least one of Ta, Nb, Hf, and Zr.

17. The MR sensor of claim 16, wherein each of the alloyed reference insertion layer and the alloyed insertion layer is CoFeTa.

* * * * *